(12) United States Patent
Alexander

(10) Patent No.: US 6,292,317 B1
(45) Date of Patent: Sep. 18, 2001

(54) METHOD AND APPARATUS FOR PERFORMING A FLAW SCAN OF A DISK DRIVE

(75) Inventor: James C. Alexander, Boulder, CO (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/388,512

(22) Filed: Sep. 2, 1999

(51) Int. Cl.[7] .................................................. G11B 27/36
(52) U.S. Cl. ................................ 360/31; 360/46; 360/67; 360/75; 360/53
(58) Field of Search ................................. 324/212, 226; 360/46, 67, 61, 63, 31, 75, 53

(56) References Cited

U.S. PATENT DOCUMENTS

| | | | |
|---|---|---|---|
| 4,298,898 | * 11/1981 | Cardot | 360/67 |
| 4,656,420 | * 4/1987 | Felleisen et al. | 324/212 |
| 4,929,894 | * 5/1990 | Monett | 360/31 |
| 5,719,719 | * 2/1998 | Tsuyoshi et al. | 360/66 |
| 6,118,602 | * 9/2000 | de la Soujeole | 360/46 |
| 6,204,660 | * 3/2001 | Lee | 324/212 |

OTHER PUBLICATIONS

"V10603 Magneto–Resistive Head, High Performance, Read/Write Pramplifier," 1998–1999 Data Storage Circuits, VTC Inc., Aug. 1, 1998, p. 1–3.

* cited by examiner

Primary Examiner—Alan T. Faber
(74) Attorney, Agent, or Firm—David M. Sigmond

(57) ABSTRACT

The present invention is directed to the high speed detection of flaws in a disk drive. In one embodiment, a preamplifier simultaneously receives and processes read signals provided by multiple heads reading a test pattern from multiple disk surfaces to detect flaws in the multiple disk surfaces. In another embodiment, a preamplifier simultaneously provides a write signal to multiple heads that simultaneously write a test pattern to multiple disk surfaces. A further embodiment reduces the time needed to detect flaws by writing a test pattern during servo track writing.

60 Claims, 11 Drawing Sheets

METHOD AND APPARATUS FOR PERFORMING A FLAW SCAN OF A DISK DRIVE

FIELD OF THE INVENTION

The present invention relates to data storage devices, and more particularly to the detection of flaws in disk drives.

BACKGROUND OF THE INVENTION

Disk drives are commonly employed in computer systems to store data. Generally, a disk drive includes several disks that each contain concentric tracks on both of their primary surfaces for storing data, a spin motor that rotates the disks about a central axis at a constant rate, heads that read data from and write data to the disk surfaces (with one head per disk surface), an actuator assembly that radially positions the heads above the desired track, and circuitry such as a preamplifier, read channel, and controller that transfers the data between the heads and a host computer external to the disk drive.

The concentric tracks on separate disk surfaces are typically aligned with each other and form cylinders. That is, each cylinder includes a set of tracks, one track per disk surface, which have the same radius and are aligned with one another. When the actuator assembly radially positions the heads, each of the heads is radially aligned with a track on the associated disk surface within the cylinder.

The host computer delivers access requests to the disk drive whenever the host computer desires to store or retrieve data. To perform an access request, the disk drive first positions the head above the track of the rotating disk specified by the access request. Once the head is properly positioned, the requested data transfer takes place. Usually the head is part of an air-bearing slider that is aerodynamically designed to ride above the disk surface on a thin cushion of air created by the rotation of the disk, although contact and pseudo-contact sliders are also known in the art.

Writing is performed by delivering a write signal with polarity-switching write current to the head while the head is positioned above the desired track. The write signal creates a variable magnetic field at a write gap of the head that induces magnetically polarized transitions into the desired track. The magnetically polarized transitions are representative of the data being stored.

Reading is performed by the head sensing the magnetically polarized transitions on a track. As the disk spins below the head, the magnetically polarized transitions on the track induce a varying magnetic field in the head. The head converts the varying magnetic signal into an analog read signal that is amplified by the preamplifier and then delivered to the read channel. The read channel converts the analog read signal into a digital signal that is processed and provided to the host computer.

Disk drives typically include servo areas and user data areas. The servo areas facilitate positioning the head over the desired location, and the user data areas store data provided by the host computer that can be subsequently accessed by the host computer. In an embedded servo format, each of the tracks includes numerous sectors, and each of the sectors includes a servo area and a user data area. The servo area typically includes separate fields for automatic gain control, synchronization, address information, and servo bursts. The servo bursts are read by the associated head and delivered to a servo control unit which sends position error signals to a voice coil motor of the actuator assembly for positioning the associated head with respect to the track. In a dedicated servo format, one disk surface contains the servo areas for all the other disk surfaces.

The manufacture of a disk drive, regardless of whether an embedded or dedicated servo format is employed, typically includes writing the servo areas on a disk (referred to as servo track writing) and then testing the disks to identify defective sectors where user data cannot reliably be stored. Typically, less than a threshold number of defective sectors are tolerated and accommodated by employing spare sectors in place of the defective sectors. The defective sectors are identified in a bad sector bit map and are no longer utilized. However, if the number of defective sectors exceeds the threshold number then the disk drive is rejected and removed from the assembly line.

The conventional approach for identifying defective sectors involves writing a test pattern to all the user data areas and reading all the user data areas to determine whether the read signals contain errors. The reading typically includes several read operations to improve reliability. If the read signal for a given sector contains more than a threshold number of errors, the sector is flagged as defective.

With conventional flaw detection procedures, the test patterns are written and subsequently read one head at a time. For example, in a disk drive with first and second heads associated with top and bottom surfaces of a disk, the heads are positioned about a given cylinder, the first head writes the test pattern to each sector on a track on the top surface of the disk, then the second head writes the test pattern to each sector a track on the bottom surface of the disk, then the first head reads the test pattern from each sector on the track on the top surface of the disk, and then the second head reads the test pattern from each sector on the track on the bottom surface of the disk. Alternatively, the first head writes the test pattern to each sector on a track on the top surface of the disk, then the first head reads the test pattern from each sector on the track on the top surface of the disk, then the second head writes the test pattern to each sector on a track on the bottom surface of the disk, then the second head reads the test pattern from each sector on the track on the bottom surface of the disk. In either case, the process is repeated cylinder by cylinder until all sectors on the top and bottom disk surfaces have been tested. Unfortunately, these techniques are very time consuming. Moreover, disk drives that employ more disks require correspondingly greater test time. For instance, a disk drive with three disks and six heads requires three times as much test time as a disk drive with one disk and two heads.

Flaw detection is a limiting factor in the throughput of disk drives that a disk drive manufacturing facility can produce in a given amount of time. This limitation can be addressed by adding more flaw detection stations to the assembly line, however this approach is inefficient and expensive. Accordingly, a need exists for an improved technique for providing rapid flaw scans in disk drives.

SUMMARY OF THE INVENTION

The present invention is directed to high speed detection of flaws in a disk drive. The high speed flaw detection of the present invention renders the flaw detection process less of a limiting factor in the manufacture of disk drives and, in most cases, improves the throughput of a disk drive manufacturing facility without the need for additional flaw detection stations.

One embodiment of the invention is directed to a preamplifier that performs high speed processing of the signals read by the heads in a disk drive during flaw detection. The preamplifier is located in an integrated circuit chip between the heads and the channel circuitry and is used to amplify read signals from the heads for processing by the channel circuitry, and in the case of a disk drive that is not a read-only device, process the write signals provided by the channel circuitry to produce the current needed by the heads to write data on the disks. The preamplifier of the present invention provides, in addition to the amplification of the read signals, the ability to simultaneously process the read signals from multiple heads to identify flaws in multiple disk surfaces and thereby increase the speed at which flaws are detected relative to conventional flaw detection schemes. In one embodiment, the read signals are sampled or detected at a time at which, if the disk is not flawed, the read signal should have a certain amplitude. For example, if the write signal is a square wave with a maximum amplitude that occurs twice for every cycle of the square wave and there is no flaw, the read signal is a sine wave signal which is expected to have positive and negative peaks within a predetermined range for each cycle of the write signal. The read signal is filtered, amplified, rectified, and then applied to a comparator to assess whether or not the read signal has a suitable amplitude. If not, the comparator provides an error signal. Generally, the error signal is provided to channel circuitry that performs further processing with respect to the flaw. For instance, the channel circuitry can more specifically identify the location of the flaw and, if necessary, mark the sector where the flaw is located as defective and assign an alternate sector to take its place.

Another embodiment of the preamplifier recognizes that it is not necessary to flag a flaw to the channel circuitry whose effect on the data read from the disk can be corrected. In this case, the channel circuitry typically includes error correction capability that, to a certain extent, can correct a read signal that is in error due to a flaw in the disk. For instance, one known error correction scheme is capable of correcting errors that extend over up to five consecutive data bit locations on the disk. In recognition of this capability, the preamplifier operates so as to detect flaws that exceed the error correction capability of the disk drive.

The present invention also provides a method for the high speed detection of flaws in a disk drive. As previously noted, presently known flaw detection schemes involve writing a test pattern to multiple disk surfaces one disk surface at a time and reading the test pattern from the disk surfaces one disk surface at a time. In the present invention, at least one of the reading and writing steps of the flaw detection operation involves simultaneously writing to or reading from multiple disk surfaces using multiple heads. In one embodiment, multiple heads simultaneously write a test pattern onto the associated disk surfaces and then multiple heads simultaneously read the test pattern from the disk surfaces to detect flaws. If all of the write heads simultaneously write the test pattern and all of the read heads simultaneously read the test pattern, the time spent on flaw detection is dramatically reduced. In another embodiment, the write heads write the test pattern one head at a time, and then the read heads simultaneously read the test pattern. In a further embodiment, the write heads simultaneously write the test pattern, and then the read heads read the test pattern one head at a time.

Further time savings are realized by incorporating the step of writing the test pattern into the servo track writing operation. As previously noted, servo track writing involves the establishment of servo areas on the disk surfaces that are used to provide location information about a head relative to the disk surfaces, for instance, the track that the head is positioned over and the location of the head relative to the center line of the track. The location information is used to maintain the head over a desired position on the disk surface and to move the head from one location to another location using the actuator assembly. Conventional servo track writing schemes do not establish a test pattern in the user data areas that is suitable for detecting flaws. The present invention recognizes that the establishment of a test pattern in the user data areas that is suitable for subsequent flaw detection can be done during servo track writing with little, if any, increase in the time required to perform the servo track writing operation. Since the servo track writing operation and the writing portion of the flaw detection operation are essentially combined into a single operation, the remainder of the flaw detection operation merely involves the reading and detection portions. As a result, the flaw detection operation consumes far less time.

These and other objects, features and advantages of the present invention will be apparent from the detailed description of the preferred embodiments which follows.

DETAILED DESCRIPTION OF THE PREFERRED EMBODIMENTS

The present invention is directed to reducing the manufacturing time of a disk drive, and particularly, to reducing the time associated with the flaw detection operation. To more fully understand the present invention, a conventional disk drive, conventional preamplifiers, and conventional servo track write and flaw detection operations are described in conjunction with FIGS. 1–3.

Figure 1:
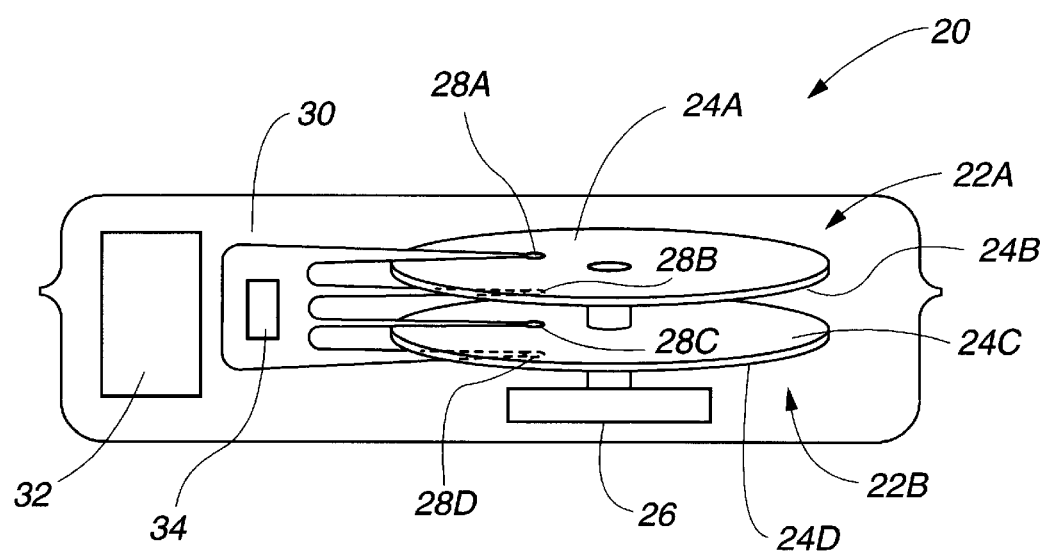
FIG. 1 is a perspective drawing of a conventional disk drive.

FIG. 1 illustrates a conventional disk drive 20 for storing data from and providing stored data to an external host computer. The disk drive 20 includes disks 22A and 22B for storing data on concentric tracks located on the disk surfaces 24A, 24B, 24C and 24D. A spin motor 26 is provided for rotating the disks 22A and 22B about their centers at a substantially constant rate. Heads 28A, 28B, 28C and 28D are associated with the disk surfaces 24A, 24B, 24C and 24D, respectively. Most heads employed in magnetic disk drives are dual element heads that include a magneto-resistive (MR) read head for reading data from a disk and a separate inductive write head for writing data to the disk. However, other disk drives employ single element heads in which a single inductive head both reads and writes data. Furthermore, in CD-ROM drives and other read-only drives, the head includes a read head but not a write head. The disk drive 20 also includes an actuator assembly 30 for radially positioning the heads 28A–28D over one of the tracks on the disk surfaces 24A–24D so that data can be written to or read from the desired track. The disk drive 20 further includes control and processing circuitry 32 that manages the operations of the spin motor 26 and the actuator assembly 30 and processes the data that is read from or written to a track in accordance with commands received from the host computer. The control and processing circuitry 32 includes a read channel, a microprocessor-based controller, and a servo control unit, among other things. A preamplifier 34 is located in a separate integrated circuit chip between the heads 28A–28D and the control and processing circuitry 32. The preamplifier 34 amplifies read signals provided by the heads 28A–28D during read operations, and processes signals received from the control and processing circuitry 32 to produce the necessary write current to the heads 28A–28D during write operations.

The manufacture of the disk drive 20 consists of many operations, including servo tracking writing and flaw detection. In an embedded servo system, servo track writing establishes the servo areas for each sector of each track on each disk surface. In a dedicated servo system, servo track writing establishes the servo areas on only a single disk surface.

The flaw detection operation occurs after servo track writing operation is completed. The flaw detection operation identifies flawed areas on the disks that fail to reliably store data. Flaws can be either "drop-out" flaws in which the read signal has a significantly smaller amplitude than what its amplitude is expected to be, or "drop-in" flaws in which the read signal has a significantly greater amplitude than what its amplitude is expected to be. When a predetermined number of flaws is detected, the control and processing circuitry 32 typically marks the sector containing the flaw as defective and assigns a spare sector to replace the defective sector. If the number of defective sectors exceeds the number of spare sectors, the disk drive is considered defective and removed from the production line.

Figure 2:
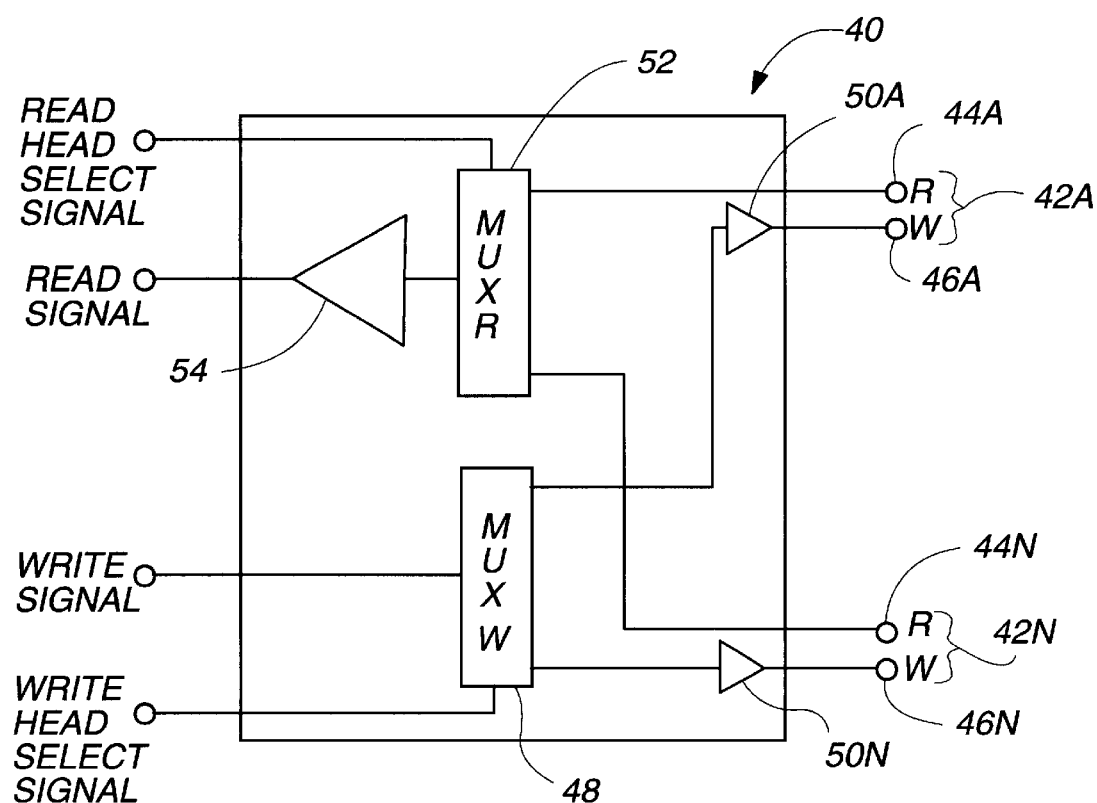
FIG. 2 is a functional block diagram of a conventional preamplifier in which a write signal is sent to one head at a time and one read signal is processed at a time.

FIG. 2 is a functional block diagram of a conventional preamplifier 40 that is adapted for use with heads 42A–42N that include respective read heads 44A–44N and separate write heads 46A–46N. The preamplifier 40 also includes a write multiplexer 48 and write drivers 50A–50N. The write multiplexer 48 receives a write signal from the control and processing circuitry 32 and a write head select signal from the control and processing circuitry 32 that selects one of the write heads 46A–46N. During a write operation to the user data areas, the write multiplexer 48 routes the write signal to a selected one of the write drivers 50A–50N, which provides a polarity-switching write current to a respective one of the write heads 46A–46N, which in turn writes to the associated disk surface. Preamplifier 40 also includes a read multiplexer 52 that receives the read signals from the read heads 44A–44N (in response to sensed magnetically polarized transitions in the associated disk surfaces) and a read head select signal from the control and processing circuitry 32 that selects one of the read heads 44A–44N. The read multiplexer 52 provides the read signal from the selected read head 44A–44N to a read amplifier 54 that amplifies the read signal and provides the amplified read signal to the control and processing circuitry 32. For convenience of illustration, other well-known features in the preamplifier 40 (such as an input buffer that adjusts the voltage of the write signal before it is applied to the write multiplexer 48) are omitted. Similar preamplifiers exist for disk drives that employ single element heads or read-only heads.

The operation of the preamplifier 40 in a flaw detection operation is now described. The control and processing circuitry 32 initially positions the read heads 44A–44N and the write heads 46A–46N within a selected cylinder. The control and processing circuitry 32 then provides a write signal, such as a square wave, representing a test pattern to the write multiplexer 48, and selects one of the write heads 46A–46N for receiving the write current from a respective one of the write drivers 50A–50N. The selected one of the write heads 46A–46N then writes the test pattern to the user data areas on the track of the associated disk surface. Thereafter, the control and processing circuitry 32 uses the read multiplexer 52 to select one of the read heads 44A–44N to provide a read signal from the user data areas of the track just written to. The read signal is expected to be a sine wave. The read signal from the selected read head is provided to the read amplifier 54, which provides the amplified read signal to the control and processing circuitry 32, which then processes the amplified read signal to identify flaws. Preferably, the read operation is repeated one or more times to improve reliability. Next, the control and processing circuitry 32 selects a different one of the write heads 46A–46N for receiving the test pattern, the test pattern is written to a track within the selected cylinder on another disk surface, the control and processing circuitry 32 selects a different one of the read heads 46A–46N to read the most recently written test pattern, and the read signal is used to identify flaws in the associated track. The process proceeds from one disk surface to the next until the test pattern has been stored in and read from all the user data areas on the selected cylinder on the disk drive. Thereafter, the control and processing circuitry 32 positions the read and write heads over an adjacent cylinder, the process is repeated until all of the user data areas on the adjacent cylinder have been tested to identify flaws, and the process continues for the remaining cylinders. In this manner, all of the user data areas on all of the disk surfaces are tested to identify flaws.

Figure 3:
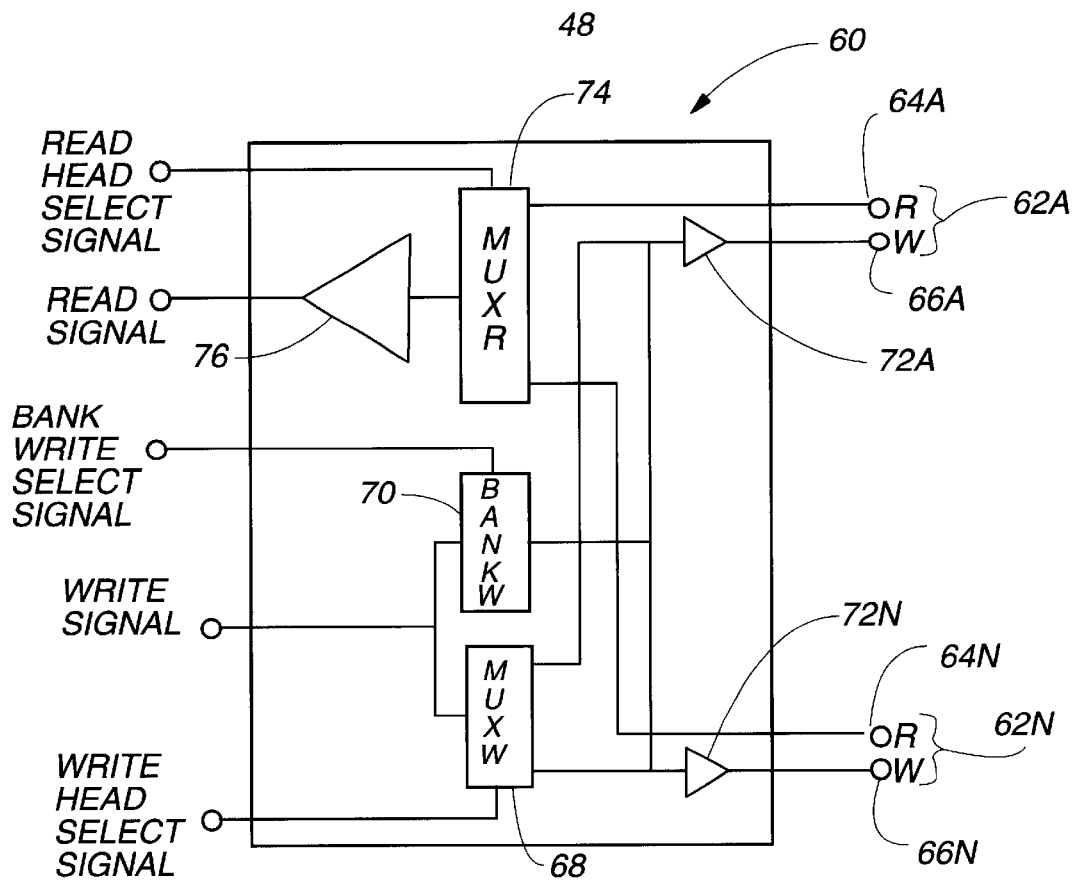
FIG. 3 is a functional block diagram of another conventional preamplifier in which a write signal is simultaneously sent to multiple heads during servo track writing and one read signal is processed at a time.

FIG. 3 is a functional block diagram of another conventional preamplifier 60. The preamplifier 60 is adapted for use with heads 62A–62N that include respective read heads 64A–64N and separate write heads 66A–66N. The preamplifier 60 also includes a write multiplexer 68, a bank write circuit 70, and write drivers 72A–72N. The write multiplexer 68 receives a write signal from the control and processing circuitry 32 and a write head select signal from the control and processing circuitry 32 to select one of the write heads 66A–66N. During a write operation to the user data areas, the write multiplexer 68 routes the write signal to a selected one of the write drivers 72A–72N, which provides a polarity-switching write current to a respective one of the write heads 66A–66N, which in turn writes the data to the associated disk surface. Bank write circuit 70 receives the write signal and a bank write select signal from the control and processing circuitry 32. During servo track writing, the bank write select signal is asserted, and the bank write circuit 70 provides the write signal to the write drivers 72A–72N, which in turn cause write heads 66A–66N to simultaneously write to their associated disk surfaces. Preamplifier 60 further includes a read multiplexer 74 and read amplifier 76, which function in the same manner as the read multiplexer 52 and read amplifier 54 in the preamplifier 40.

The operation of the preamplifier 60 in the flaw detection process is substantially the same as that described for the preamplifier 40. Namely, the processing and control circuitry 32 utilizes the write multiplexer 68 to select one of the write heads 66A–66N for receiving the write signal and storing the test pattern on one of the tracks on the associated disk surface, the processing and control circuitry 32 utilizes the read multiplexer 74 to select one of the read heads 64A–64N for reading the test pattern from the user data areas of the track just written to and tests the read signal to identify flaws, the process is repeated with the other read and write heads, one disk surface at a time, until all of the user data areas on the cylinder have been tested to identify flaws, and then the process is repeated, one cylinder at a time, until all of the user data areas on all of the disk surfaces have been tested to identify flaws.

Thus, preamplifiers 40 and 60 and other conventional preamplifiers are utilized in flaw scan operations in which only one read head is enabled at any given time and only one write head is enabled at any given time.

Figure 4:
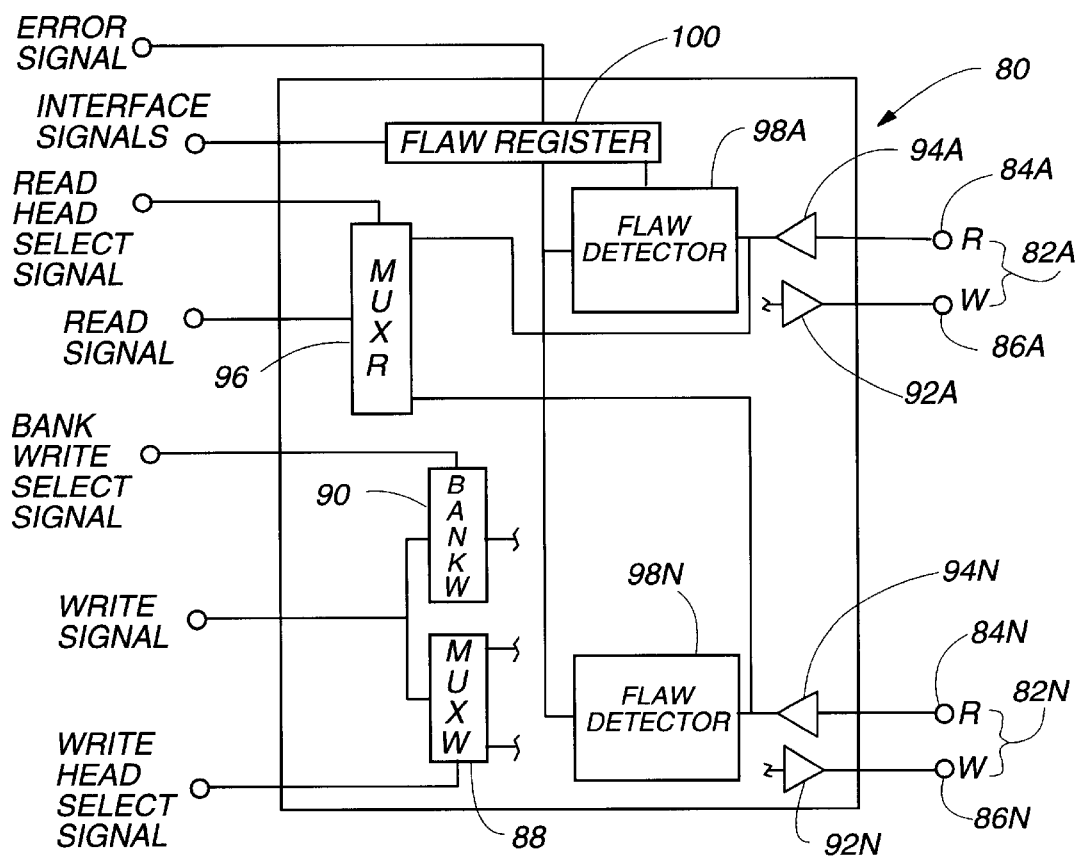
FIG. 4 is a block diagram of a preamplifier of the present invention in which a write signal is simultaneously sent to multiple heads and multiple read signals are simultaneously received and processed.

FIG. 4 is a functional block diagram of a preamplifier 80 that is capable of reducing the time required to perform a flaw detection operation in accordance with the present invention. The preamplifier 80 is adapted for use with heads 82A–82N that include respective read heads 84A–84N and separate write heads 86A–86N. The preamplifier 80 includes a write multiplexer 88, a bank write circuit 90, and write drivers 92A–92N that function the same way as the write multiplexer 68, bank write circuit 70 and write drivers 72A–72N of the preamplifier 60. For convenience of illustration, the connections between the write multiplexer 88 and the write drivers 92A–92N and the connections between the bank write circuit 90 and the write drivers 92A–92N are not shown but are identical to the corresponding connections in the preamplifier 60. The preamplifier 80 also includes read amplifiers 94A–94N connected to the read heads 84A–84N, respectively, and a read multiplexer 96. The read amplifiers 94A–94N amplify the read signals from the read heads 84A–84N, respectively. The read multiplexer 96 receives the amplified read signals from the read amplifiers 94A–94N and a read head select signal from the control and processing circuitry 32 that selects one of the read heads 84A–84N. The read multiplexer 96 provides the amplified read signal from the selected read head 84A–84N to the control and processing circuitry 32. The preamplifier 80 further includes flaw detectors 98A–98N and a flaw register 100 for use in flaw detection. The flaw detectors 98A–98N simultaneously receive the amplified read signals from read amplifiers 94A–94N, respectively, and simultaneously compare the amplified read signals to predetermined threshold values in order to identify flaws. The flaw detectors 98A–98N each generate a flaw detect signal upon detection of a flaw in their respective amplified read signal. The flaw register 100 receives the flaw detect signals from each of the flaw detectors 98A–98N and also sends and receives interface signals to and from an interface coupled to the control and processing circuitry 32. The flaw register 100 includes storage locations that each receive one of the flaw detect signals from the flaw detectors 98A–98N. For each storage location, an error bit is set when the corresponding flaw detect signal is asserted. The flaw register 100 provides an error signal to the control and processing circuitry 32 when any of the error bits are set. The error signal can be an interrupt signal or other appropriate fault signal.

In response to the error signal, the control and processing circuitry 32 implements appropriate corrective measures. For instance, the control and processing circuitry 32 can immediate terminate the read portion of the flaw detect operation, or alternatively, can continue reading the test patterns from all the sectors on the current track. Preferably, the control and processing circuitry 32 verifies the existence and location of the flaw before marking the sector containing the flaw as bad and replacing the sector with another sector.

Although the read amplifiers 94A–94N are coupled to the read heads 84A–84N, respectively, it should be noted that if the read signals from the read heads 84A–84N have sufficient amplitudes to be monitored by the flaw detectors 98A–98N, respectively, then the read amplifiers 94A–94N can be replaced by a single read amplifier connected to the output of the read multiplexer 96 in the manner shown for the read multiplexer 74 and the read amplifier 76 of the preamplifier 60.

Figure 5:
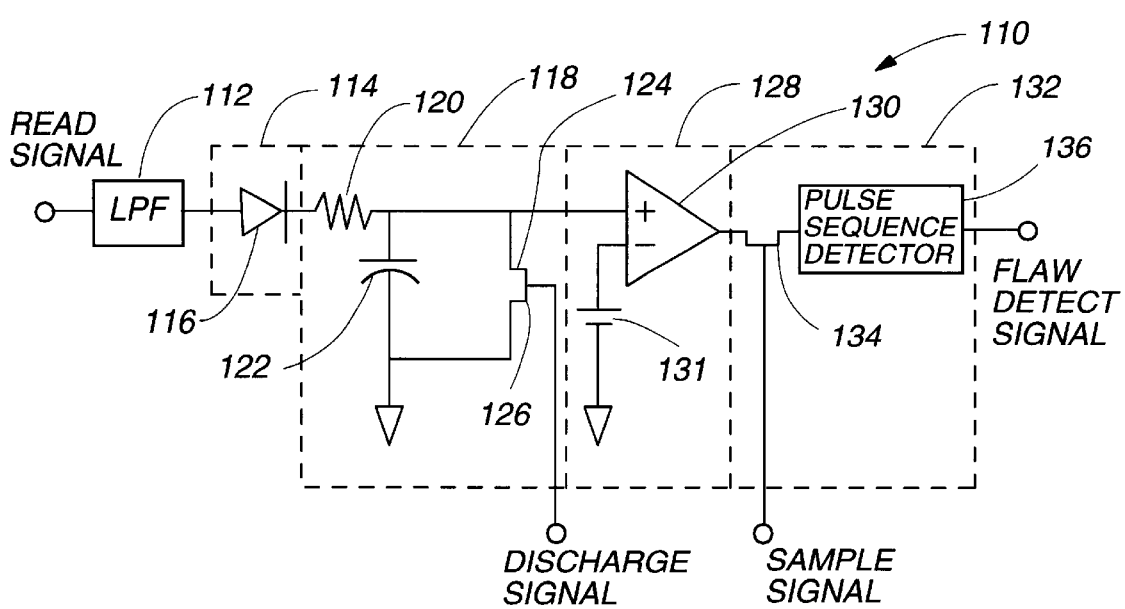
FIG. 5 is a circuit diagram of a flaw detection circuit suitable for use in the preamplifier of FIG. 4 that detects drop-out flaws in positive cycles of the read signals.

FIG. 5 illustrates a first flaw detection circuit 110 in each of the flaw detectors 98A–98N. The first flaw detection circuit 110 detects drop-out flaws in the positive peaks of the read signals. As is seen, the first flaw detection circuit 110 includes a low pass filter 112, a half-wave rectifier 114, a peak detector 118, a threshold detector 128, and a sequence discriminator 132. The low pass filter 112 receives the amplified read signal and removes high frequency noise from the signal. A Butterworth-type filter having a steep cutoff characteristic is the preferred analog filtering technique, although other filtering techniques can be used. The half-wave rectifier 114 receives the filtered signal from the filter 112 and transfers only the positive portion of the filtered signal as a rectified signal to subsequent circuitry. The half-wave rectifier is implemented by a diode 116.

The peak detector 118 receives the rectified signal from the half-wave rectifier 114 and generates a peak detection signal composed of pulses having amplitudes proportional to the peaks of the rectified signal. The peak detector 118 is implemented by a resistor 120, a capacitor 122, and a switch 124. The resistance of the resistor 120 and the capacitance of the capacitor 122 determine the RC time constant, that is, the time it takes to charge the capacitor 122. The RC time constant time is less than about ½ the period of the write signal that is used to write the test pattern. The RC time constant can be made variable or programmable by using an adjustable resistor 120 and/or capacitor 122, or by other means. The switch 124 connected in parallel with the capacitor 122 determines whether the capacitor 122 charges or discharges. The switch 124 is implemented by an N-channel field-effect transistor (FET) 126. Applying a discharge signal to the gate of the FET 126 turns on the FET 126 and effectively renders the FET 126 a short circuit across the capacitor 122. Removing the discharge signal from the gate of FET 126 turns off the FET 126 and effectively renders the FET 126 an open circuit across the capacitor 122. When the FET 126 is turned off the capacitor 122 can accumulate charge. Conversely, when the FET 126 is turned on any charge on the capacitor 122 is rapidly discharged to ground. The discharge signal is synchronized with the rectified signal so that capacitor 122 charges during the pulses of the rectified signal and discharges between the pulses of the rectified signal. The discharge signal can be provided by a clock signal with a leading edge that occurs shortly after the read signal becomes negative and a trailing edge that occurs shortly before the read signal becomes positive. Although a discharge signal with leading and trailing edges that occur at zero crossings of the read signal would provide adequate timing for the FET 126, this might cause a race condition. At any rate, the voltage that accumulates across the capacitor 122 resembles an integral of the pulse of the rectified signal being applied. Since the pulses of the rectified signal have substantially similar pulse lengths, the voltage that accumulates across the capacitor 122 is proportional to the amplitude of the pulse of the rectified signal being applied. The voltage that accumulates across the capacitor 122 provides a peak detection signal.

The threshold detector 128 compares the peak detection signal with an expected value to determine whether a flaw is present on the disk. The threshold detector 128 is implemented with a comparator 130 and a voltage source 131. The comparator 130 compares the peak detection signal with a positive threshold voltage provided by the voltage source 131. The peak detection signal is provided to the non-inverting input of the comparator 130 and the threshold voltage is provided to the inverting input of the comparator 130. In response, the comparator 130 outputs a digital comparison signal with a first logical value (such as high) if the peak detection signal is greater than the threshold voltage, which indicates that a drop-out flaw is not present. Conversely, if the peak detection signal is less than the threshold voltage, which indicates that a drop-out flaw is present, then the comparator 130 outputs the comparison signal with a second logical value (such as low).

The sequence discriminator 132 inspects the comparison signal to identify occurrences of flaws. The sequence discriminator 132 is implemented with a FET 134 and a pulse sequence detector 136. When a sample signal is applied to the gate of the FET 134, the FET 134 turns on and the pulse sequence detector 136 samples the comparison signal. Conversely, when the sample signal is removed, the FET 134 turns off and the pulse sequence detector 136 is isolated from the comparison signal. The sample signal is synchronized with the peak detection signal so that the sampled comparison signal occurs at or near the peaks of the peak detection signal. The sample signal can be implemented by a clock signal with a leading edge that occurs at the positive peak of the read signal and a trailing edge that occurs shortly after the positive peak of the read signal but well before the read signal becomes negative. Thus, the FET 134 samples the comparison signal at times when if no flaw is present then the sampled comparison signal provides a pulse, and if a flaw is present then the sampled comparison signal does not provide a pulse. The pulse sequence detector 136 receives the sampled comparison signal from the FET 134 and determines whether a predetermined number of consecutive pulses are missing. If so, the pulse sequence detector 136 sends the flaw detect signal to the flaw register 100.

For instance, if no flaws occur, the sampled comparison signal will be a series of regularly occurring pulses in which one pulse is separated from the next pulse by a substantially fixed period of time. If, however, a flaw occurs, then the sampled comparison signal will be missing a pulse. In this case, the pulse sequence detector 136 detects a deviation from the regularly occurring pulse stream and provides the flaw detect signal in response.

Figure 6A:
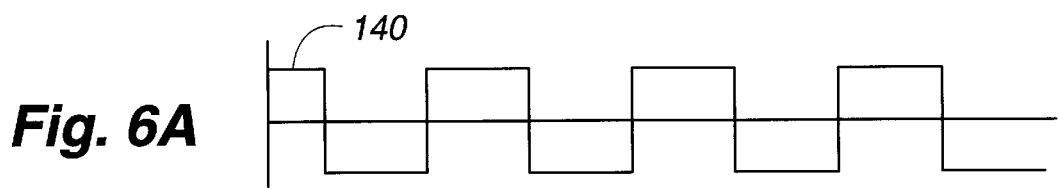
FIGS. 6A–6H illustrate various signals related to the flaw detection circuit of FIG. 5.
Figure 6B:
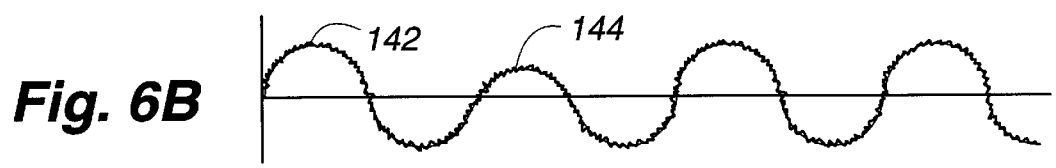
Figure 6C:
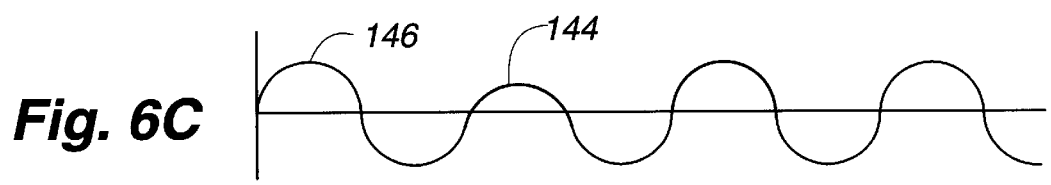
Figure 6D:
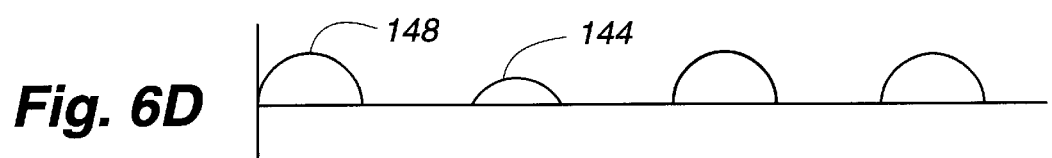
Figure 6E:
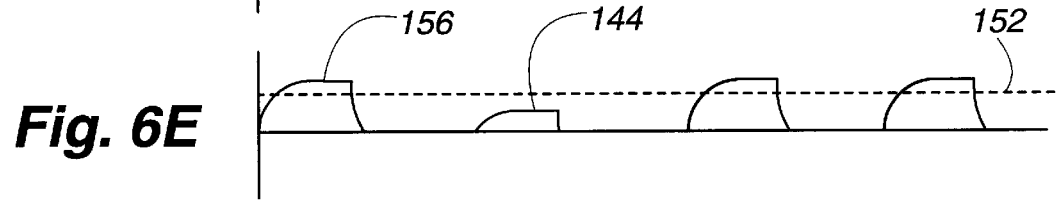
Figure 6F:
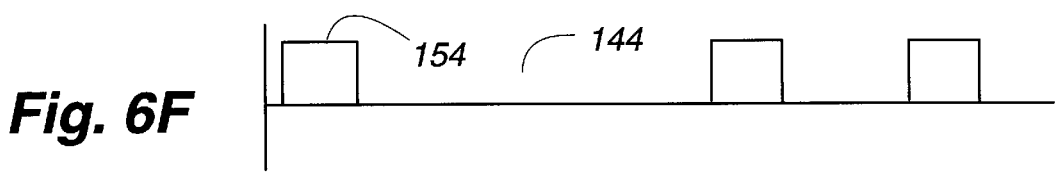
Figure 6G:
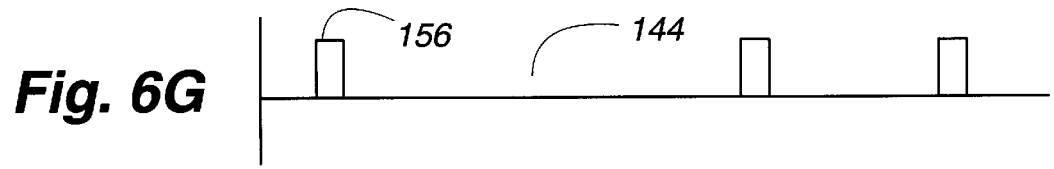
Figure 6H:
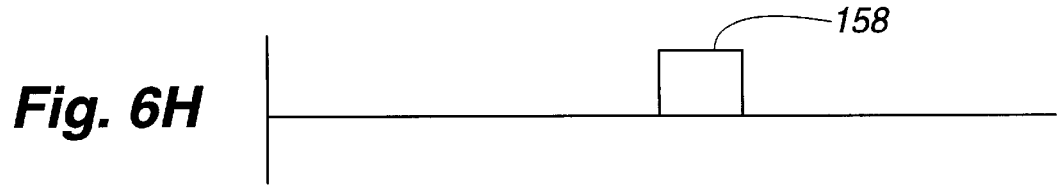

FIGS. 6A–6H illustrate various signals that occur during the operation of the preamplifier 80 when first flaw detection circuit 110 is utilized. FIG. 6A illustrates the polarity-switching write current 140, a square wave, that is applied to the write head 86A in order to record magnetically polarized transitions representative of the test pattern on the associated disk surface. FIG. 6B illustrates a read signal 142 provided by the read head 84A in response to the read head 84A sensing the magnetically polarized transitions previously written as the test pattern to the associated disk surface. The read signal 142 reveals a drop-out flaw 144 in which the amplitude of the read signal 142 is significantly less than it should be. FIG. 6C illustrates the filtered signal 146 provided by the low-pass filter 112. The filtered signal 146 is devoid of the high frequency noise found in the read signal 142. For convenience of illustration, the filtered signal 146 has been scaled to ignore the amplification of the read signal 142 by the read amplifier 94A. FIG. 6D illustrates the positive, half-wave signal 148 generated by half-wave rectifier 114. The half-wave signal 148 contains only the positive half-cycle of the filtered signal 146. FIG. 6E illustrates a peak detection signal 150 produced by the peak detector 118. The peak detection signal 150 tracks the rising edge of the half-wave signal 148. Thereafter, the peak detection signal 150 remains substantially constant while the FET 126 is turned off since the accumulated charge from the falling edge of the peak detection signal 150 is partially offset by leakage from the capacitor 122. The peak detection signal 150, like the read signal 142, the filtered signal 146 and the half-wave signal 148, reflects the drop-out flaw 144 which is less than the threshold voltage 152. FIG. 6F shows the comparison signal 154 provided by threshold detector 128 in response to the peak detection signal 150 and the threshold voltage 152. In this instance, the drop-out flaw 144 is reflected by a missing pulse. FIG. 6G shows the sampled comparison signal 156 provided by the FET 134 to the pulse sequence detector 136. If no flaws were present, the sampled comparison signal 156 would have a relatively constant frequency, or stated differently, the time between consecutive pulses of the sampled comparison signal 156 would be relatively constant. The presence of the drop-out flaw 144 is reflected by the missing pulse. FIG. 6H shows the flaw detect signal 158 generated by the pulse sequence detector 136. The pulse sequence detector 136 detects the missing pulse, and in response to the missing pulse produces the flaw detect signal 158 which is logged in the flaw register 100. The flaw detect signal 158 is deasserted after it is logged.

Figure 7:
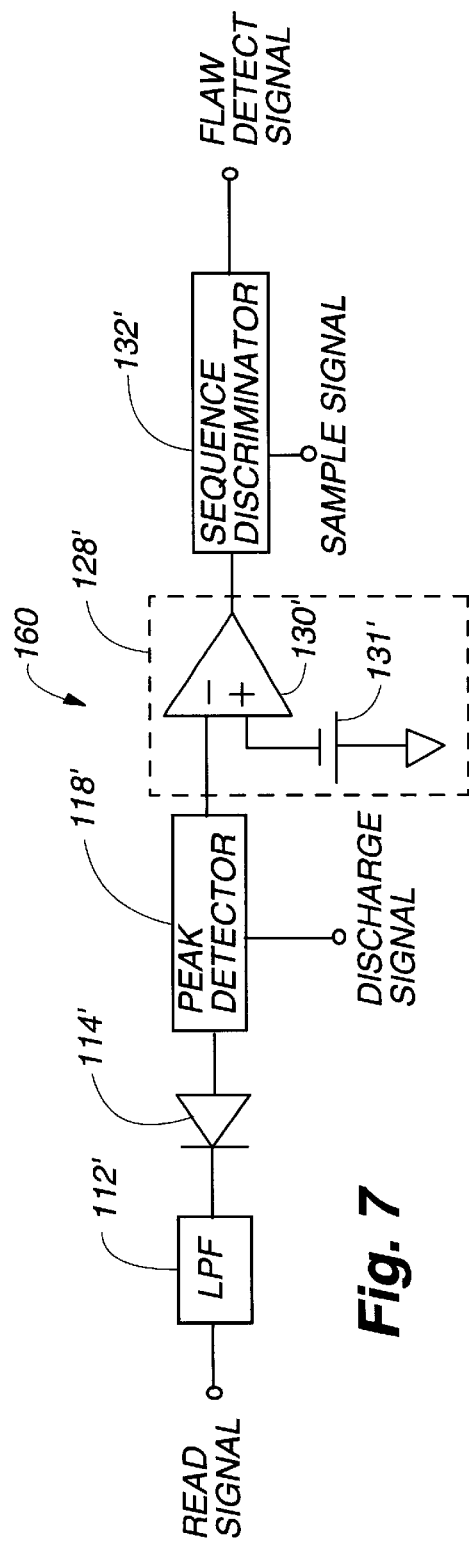
FIG. 7 is a circuit diagram of a flaw detection circuit suitable for use in the preamplifier of FIG. 4 that detects drop-out flaws in the negative cycles of the read signals.

FIG. 7 illustrates a second flaw detection circuit 160 that is also included in each of the flaw detectors 98A–98N. The second flaw detection circuit 160 detects flaws in the negative peaks of the read signals. The second flaw detection circuit 160 includes a low pass filter 112', a half-wave rectifier 114', a peak detector 118', a threshold detector 128', and a sequence discriminator 132'. The second flaw detection circuit 160 is substantially identical to the first flaw detection circuit 110 except that the half-wave rectifier 114' transfers only the negative portion of the filtered signal to the subsequent circuitry, the inverting and non-inverting inputs of the comparator 130' are connected to the peak detector 118' and the voltage source 131', respectively, and the voltage source 131' provides a negative threshold voltage to the comparator 130'.

Figure 8:
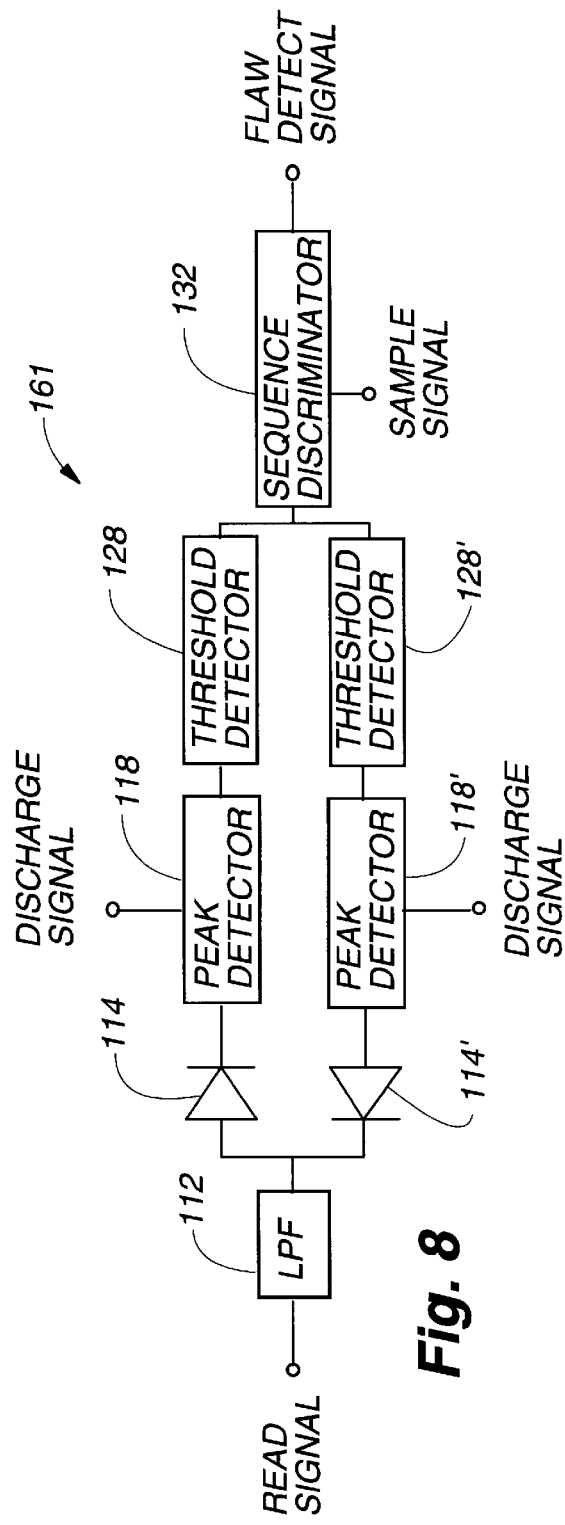
FIG. 8 is a circuit diagram of a flaw detection circuit that combines the flaw detection circuits of FIGS. 5 and 7.

FIG. 8 illustrates a flaw detection circuit 161 that combines the first flaw detection circuit 110 and the second flaw detection circuit 160. For increased efficiency, the first and second flaw detection circuits 110 and 160 share the low-pass filter 112 and the sequence discriminator 132. Accordingly, the low pass filter 112' and the sequence discriminator 132' are unnecessary.

Although the first and second flaw detection circuits 110 and 160 detect drop-out flaws, these circuits can easily be modified to detect drop-in flaws. In the case of first flaw detection circuit 110, the threshold voltage provided by the voltage source 131 is increased, and the inverting and non-inverting inputs of the comparator 130 are connected to the threshold detector 118 and the voltage source 131, respectively. In this manner, the comparator 128 generates a pulse unless the peak detection signal exceeds the threshold voltage, in which case the comparator 128 fails to generate a pulse and the pulse sequence detector 136 identifies the missing pulse and generates the flaw detect signal. In the case of the second flaw detection circuit 160, the threshold voltage provided by the voltage source 131' is increased (to a greater negative value), and the non-inverting and inverting inputs of the comparator 130' are connected to the threshold detector 118' and the voltage source 131', respectively. In this manner, the comparator 128' generates a pulse unless the peak detection signal exceeds (is more negative than) the threshold voltage, in which case the pulse sequence detector 136' identifies the missing pulse and generates the flaw detect signal.

Alternatively, separate third and fourth flaw detection circuits can be included in each of the flaw detectors 98A–98N for detecting drop-in flaws in the positive and negative peaks of the read signals. Such third and fourth flaw detection circuits can make common use of the low pass filter 112, but a second sequence discriminator would be necessary.

Figure 9:
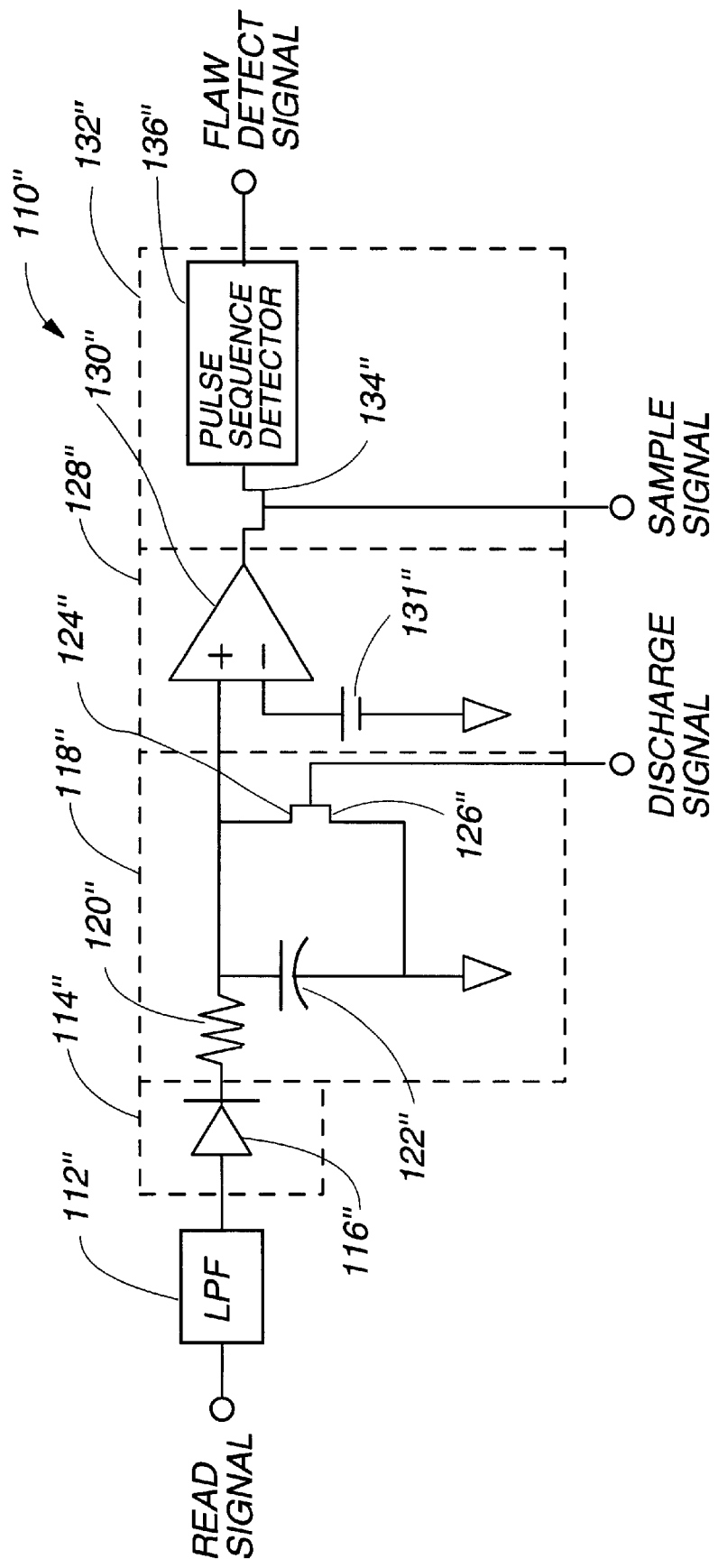
FIG. 9 is a circuit diagram of a flaw detection circuit suitable for use in the preamplifier of FIG. 4 that detects drop-in flaws in positive cycles of the read signals.

FIG. 9 illustrates a modified first flaw detection circuit 110" that detects drop-in flaws. The first flaw detection circuit 110" includes a low-pass filter 112", a half-wave rectifier 114", a peak detector 118", a threshold detector 128", and a sequence discriminator 132". The half-wave rectifier 114" is implemented with a diode 116", the peak detector 118" is implemented with a resistor 120", a capacitor 122" and a switch 124" (implemented by FET 126"), the threshold detector 128" is implemented with a comparator 130" and a voltage source 131", and the sequence discriminator 132" is implemented with a FET 134" and a pulse sequence detector 136". In comparison to the first flaw detection circuit 110, the voltage source 131" provides a greater threshold voltage than the voltage source 131, and the connections to the inputs of the comparator 128" (as compared to comparator 128) are reversed. As a result, the first flaw detection circuit 110" detects drop-in flaws.

Figure 10:
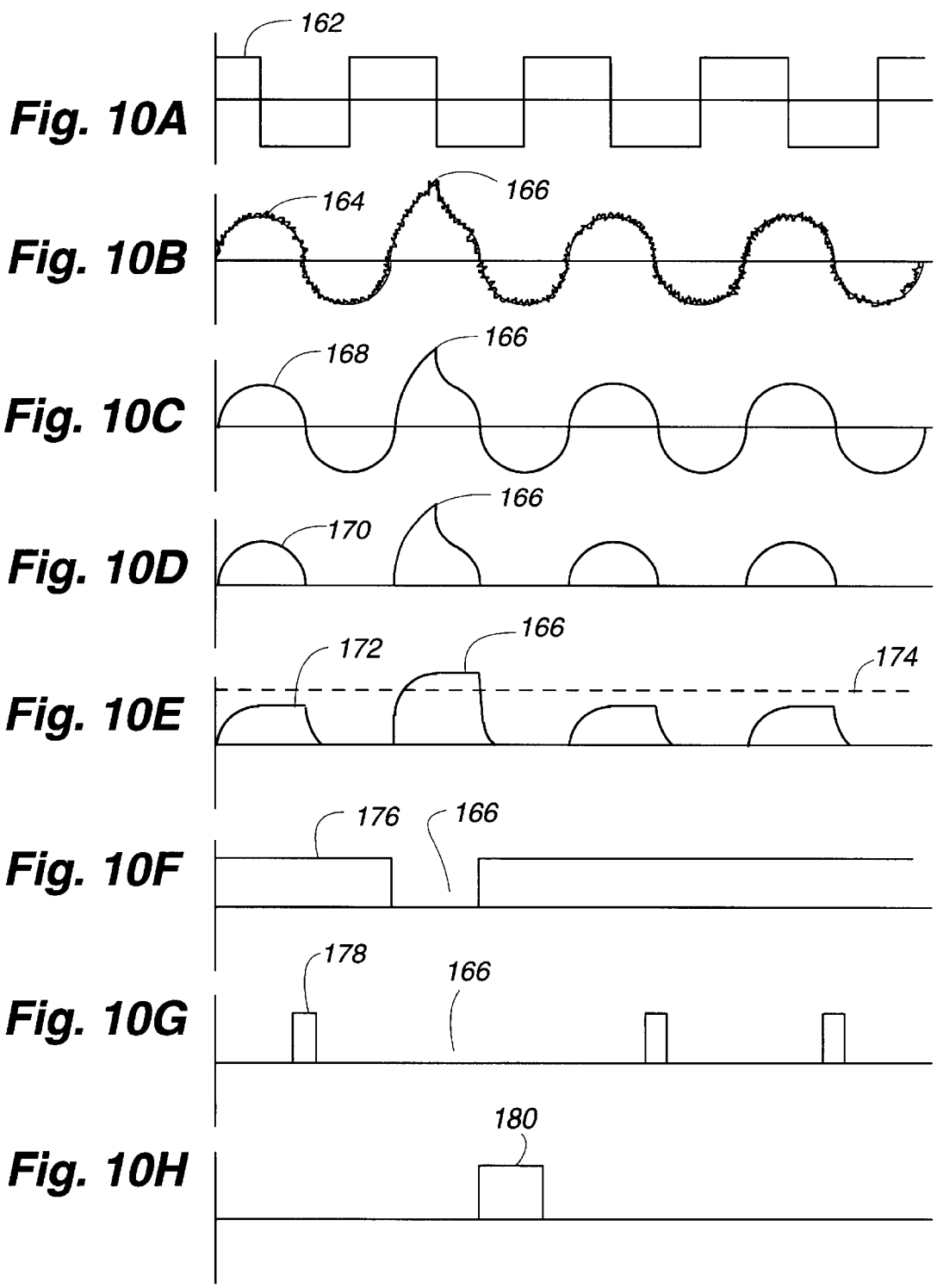
FIGS. 10A–10H illustrate various signals related to the flaw detection circuit of FIG. 9.

FIGS. 10A–10H illustrate various signals that occur during the operation of the preamplifier 80 when first flaw detection circuit 110" is utilized. FIG. 10A illustrates the polarity-switching write current 162, a square wave, that is applied to the write head 86A in order to record magnetically polarized transitions representative of the test pattern on the associated disk surface. FIG. 10B illustrates a read signal 164 provided by the read head 84A in response to the read head 84A sensing the magnetically polarized transitions previously written as the test pattern to the associated disk surface. The read signal 164 reveals a drop-in flaw 166 in which the amplitude of the read signal 164 is significantly more than it should be. FIG. 10C illustrates the filtered signal 168 provided by the low-pass filter 112". The filtered signal 168 is devoid of the high frequency noise found in the read signal 164. For convenience of illustration, the filtered signal 168 has been scaled to ignore the amplification of the read signal 164 by the read amplifier 94A. FIG. 10D illustrates the positive, half-wave signal 170 generated by half-wave rectifier 114". The half-wave signal 170 contains only the positive half-cycle of the filtered signal 168. FIG. 10E illustrates a peak detection signal 172 produced by the peak detector 118". The peak detection signal 172 tracks the rising edge of the half-wave signal 170. Thereafter, the peak detection signal 172 remains substantially constant while the FET 126" is turned off since the accumulated charge from the falling edge of the peak detection signal 172 is partially offset by leakage from the capacitor 122". The peak detection signal 172, like the read signal 164, the filtered signal 168 and the half-wave signal 170, reflects the drop-in flaw 166 which is greater than the threshold voltage 174. FIG. 10F shows the comparison signal 176 provided by threshold detector 128" in response to the peak detection signal 172 and the threshold voltage 174. In this instance, the drop-in flaw 166 is reflected by a low logic level. FIG. 10G shows the sampled comparison signal 178 provided by the FET 134" to the pulse sequence detector 136". If no flaws were present, the sampled comparison signal 178 would have a relatively constant frequency, or stated differently, the time between consecutive pulses of the sampled comparison signal 178 would be relatively constant. The presence of the drop-in flaw 166 is reflected by the missing pulse. FIG. 10H shows the flaw detect signal 180 generated by the pulse sequence detector 136". The pulse sequence detector 136" detects the missing pulse, and in response to the missing pulse produces the flaw detect signal 180 which is logged in the flaw register 100. The flaw detect signal 180 is deasserted after it is logged.

Figure 11:
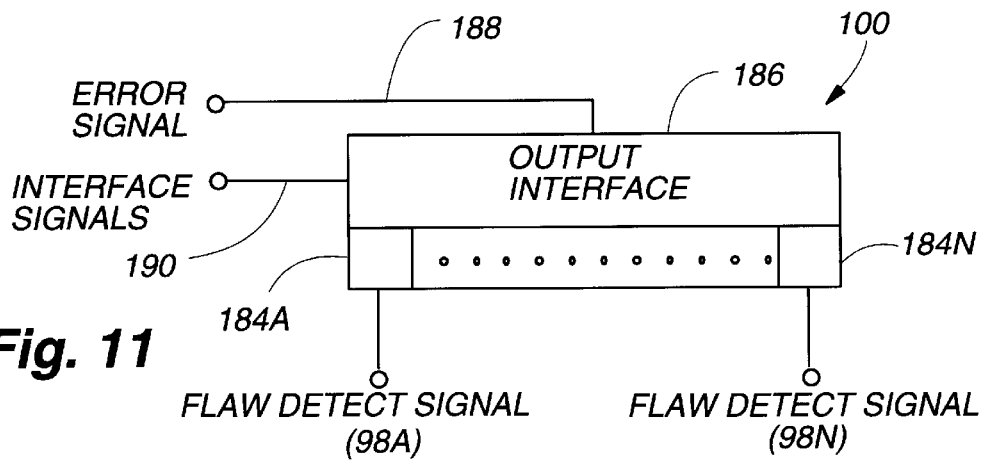
FIG. 11 illustrates a flaw register suitable for use in the preamplifier of FIG. 4.

FIG. 11 illustrates the flaw register 100 which receives the flaw detect signals, stores flaw related information and provides the control and processing circuitry 32 with flaw related information. The flaw register 100 includes storage locations 184A–184N that correspond to the read heads 84A–84N, respectively. The storage locations 184A–184N receive flaw detect signals from the flaw detectors 98A–98N, respectively. The storage locations 184A–184N arc initially cleared. When a flaw detect signal from one of the flaw detectors 98A–98N is provided to the associated storage location, thereby indicating that a flaw has been detected, an error bit in the storage location is set and remains set until cleared by the control and processing circuitry 32. If desired, the storage locations 184A–184N can each include a counter that is initially set to zero and is incremented each time a flaw is detected by the corresponding flaw detector. The flaw register 100 further includes an output interface 186 for transferring flaw related information to the control and processing circuitry 32. The output interface 186 includes an error line 188 for sending the error signal to the control and processing circuitry 32 to indicate that a flaw has been detected. The output interface 186 further includes control logic for determining when the error signal is generated. For instance, the control logic can generate the error signal when any of the error bits are set. Alternatively, if counters are employed, the control logic can generate the error signal after the number of flaws detected per sector exceeds a predetermined number, and then reset the counter for each sector. As an alternative to sending an error signal, the control and processing circuitry 32 can periodically query the output interface 186 to determine whether or not a flaw has been detected. The output interface 186 also includes a flaw register interface 190 that permits the control and processing circuitry 32 to clear the storage locations 184A–184N and to read the data stored in the storage locations 184A–184N. The data stored in the storage locations 184A–184N can be transferred to the control and processing circuitry 32 either serially or in parallel. The control and processing circuitry 32 can use this information to address the flaw, for example, by confirming the length of the flaw, determining whether or not the sector containing the flaw should be mapped out, and if so, assigning a backup or alternate sector to replace the flawed sector.

In the foregoing description of the preamplifier 80, the frequency of the square wave write signal provided to the write heads 86A–86N to write the test pattern was chosen so that a cycle of the square wave corresponds to two bit locations (or magnetically polarized transitions) on the associated disk surface. By using a square wave with this frequency, flaws are detected that are as small as the length on the disk media accorded to a single bit of data. As a result, the preamplifier 80 detects single bit flaws. However, the preamplifier 80 can be modified to detect uncorrectable flaws and allow correctable flaws to be subsequently corrected.

To elaborate, many disk drives incorporate error correction schemes that are capable of correcting errors that are up to a certain number of bits in length. For instance, one error correction scheme used for 512 byte (4096 bit) sectors can correct flaws unless seven or more "bad" bytes are detected, where a bad byte includes four or more error bits. Consequently, if the preamplifier 80 ignores flaws which can be corrected by the error correcting scheme, and the sector containing these flaws is otherwise good, then the sector need not be replaced. Advantageously, the preamplifier 80 can be modified to generate the flaw detect signals in response to flaws which the error correcting scheme is incapable of correcting and to ignore other flaws.

For instance, the pulse sequence detector 136 can be modified to include first and second counters. The sampled comparison signal generated by the FET 134 is applied to the first counter. In the sampled comparison signal, each sample is represented by a single bit (0=flaw, 1=no flaw). The first counter generates a bad byte signal if four or more 0's are detected in a given byte. The first counter can be implemented by a three-bit counter which, for every eight consecutive samples, counts the number of samples that are 1's, generates the bad byte signal if the count is four or less unless overflow occurs (indicating all eight samples were 1's) after eight consecutive samples (representing one byte) are received, and then resets. The bad byte signals are applied to the second counter which generates the flaw detect signal when seven or more bad byte signals are received for the sector being tested. The second counter can be implemented with a three-bit counter which, for every 4096 consecutive samples, counts the number of bad byte signals that are 1's, generates the flaw detect signal if the count reaches seven, and then resets after 4096 consecutive samples (representing one sector) are received.

Other error correction schemes are capable of correcting up to a certain number of consecutive error bits. For instance, one error correction scheme is capable of correcting errors that are up to five consecutive bits in length. Thus, flaws with a length that is less than or equal to five consecutive bits can be addressed by this error correcting scheme.

In this instance, the peak detector 118 can be modified to be an envelope detector. Specifically, the RC time constant of the peak detector 118 can be adjusted by changing the resistance of the resistor 120 and/or the capacitance of the capacitor 122, replacing the FET 124 with a resistor, connecting the inverting and non-inverting inputs of the comparator 130 to the threshold detector 118 and the voltage source 131, respectively, and replacing the sequence discriminator 132 with a pulse length detector. By increasing the RC time constant to become greater than about ½ the period of the write signal that is used to write the test pattern, and omitting the FET 124 since the capacitor 122 need not be rapidly discharged, the peak detector 118 becomes an envelope detector which generates a continuous analog signal with an amplitude that tracks the positive peaks of the rectified signal. The pulse length detector serves to determine when the comparator provides a positive pulse for a predetermined period of time, in which case a predetermined number of consecutive pulses in the rectified signal are below the threshold voltage and the flaw detect signal is generated.

Figure 12:
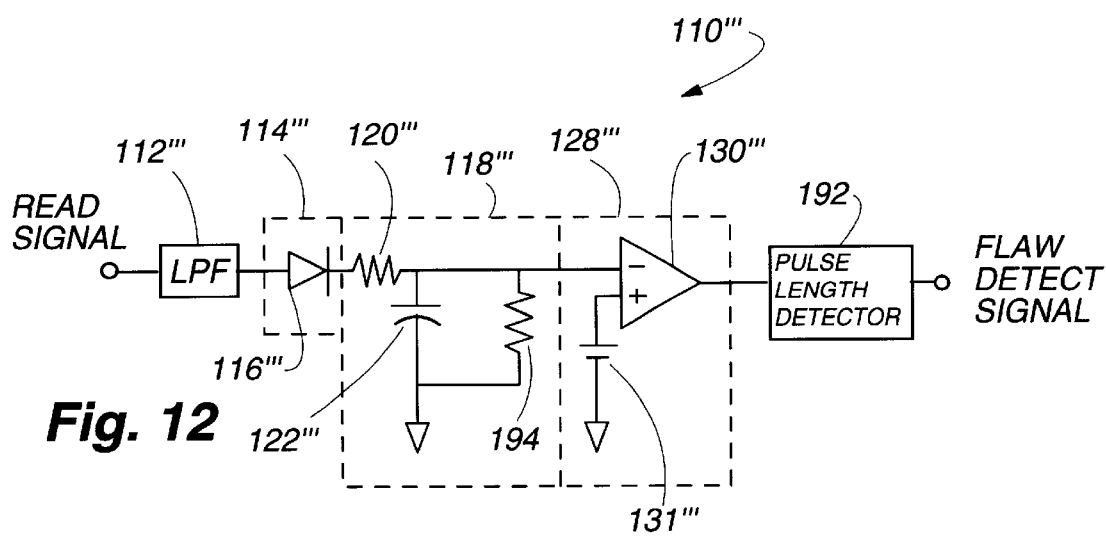
FIG. 12 is a circuit diagram of another flaw detection circuit suitable for use in the preamplifier of FIG. 4 that detects consecutive drop-out flaws in positive cycles of the read signals.

FIG. 12 illustrates a modified first flaw detection circuit 110''' that utilizes an envelope detector and generates the flaw detect signal when a predetermined number of consecutive flaws are detected. The first flaw detection circuit 110''' includes a low-pass filter 112''', a half-wave rectifier 114''', an envelope detector 118''', a threshold detector 128''', and a pulse length detector 192. In comparison to the first flaw detection circuit 110, the peak detector 118 has been replaced by the envelope detector 118''', the connections to the inputs of the comparator 128''' are reversed, and the sequence discriminator 132 has been replaced by the pulse length detector 192. The half-wave rectifier 114''' is implemented with a diode 116''', the envelope detector 118''' is implemented with a resistor 120''', a capacitor 122''' and a resistor 194, and the threshold detector 128''' is implemented with a comparator 130''' and a voltage source 131'''. The envelope detector 118''' has an RC time constant that is greater than ½ the time period of the write signal that is used to write the test pattern, and the FET 124 is replaced by the resistor 194. As a result, the envelope detector 118''' generates a peak detection signal that tracks the peaks of the rectified signal. The envelope detector 118''' and the voltage source 131''' are connected to the inverting and non-inverting inputs, respectively, of the comparator 128'''. Accordingly, the comparator 128''' generates a positive comparison signal as long as one or more consecutive pulses of the rectified signal are below the threshold voltage. The pulse length detector 192 determines when the comparison signal provides a positive pulse that exceeds a predetermined time period (such as five consecutive positive peaks of the read signal), in which case the pulse length detector 192 generates the flaw detect signal. In this manner, the envelope detector 118''' can be used to detect flaws the exceed the capability of the error correcting scheme of the disk drive.

Figure 13:
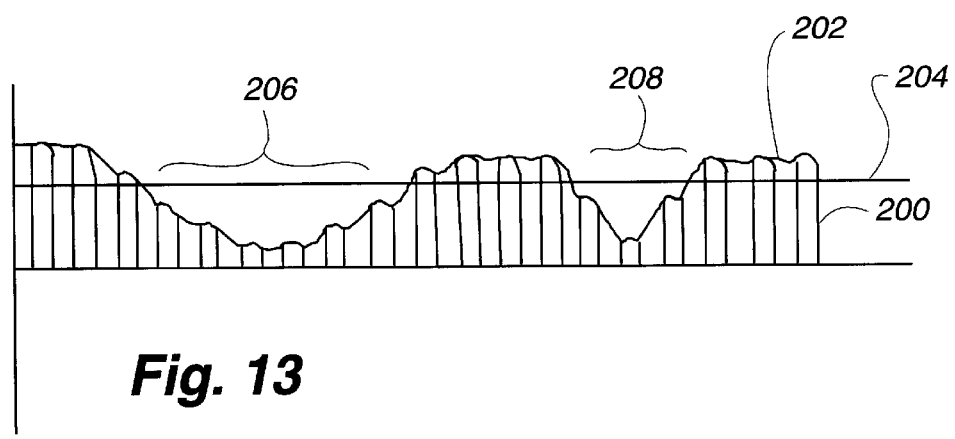
FIG. 13 illustrates various signals related to the flaw detection circuit of FIG. 12.

FIG. 13 illustrates various signals that occur during the operation of the first flaw detection circuit 110'''. The low-pass filter 112''' and the half-wave rectifier 114''' operate to produce a filtered, half-wave rectified, sine wave signal 200. The envelope detector 118''' produces an envelope signal 202 that tracks the peaks of the rectified signal 200. If the envelope signal 202 drops below the threshold voltage 204 for more that five consecutive pulses of the rectified signal 200, such as during the time period 206, then the threshold detector 128''' generates a positive pulse for a sufficiently long duration that the pulse length detector 192 identifies an uncorrectable drop-out flaw and asserts the flaw detect signal. On the other hand, if the envelope signal 202 drops below the threshold voltage 204 for less than six consecutive pulses of the rectified signal 200, such as during the time period 208, then the threshold detector 128''' generates a positive pulse but the positive pulse does not have a long enough duration for the pulse length detector 192 to assert the flaw detect signal. In this case, the drop-out flaw has a sufficiently short duration that it can be corrected by the error correction scheme of the disk drive.

The first flaw detection circuit 110''' can be modified in a similar manner to that noted with respect to FIGS. 7 and 8 to process the negative portion of the read signal. The first flaw detection circuit 110''' can also be modified to detect drop-in flaws as noted with respect to FIG. 9.

Furthermore, in the embodiments discussed above, additional logic or firmware can readily be incorporated to implement a scheme in which a flaw at a particular bit location on a disk surface must be indicated by two or more read signals from that bit location, such as consecutive read signals separated by one disk revolution, in order to improve reliability, as understood by those skilled in the art.

The present invention is directed to reducing the time required to perform a flaw scan. The present invention includes a method which simultaneously makes use of two or more write heads in performing the write portion of the flaw scan operation and/or simultaneously makes use of two or more read heads in implementing the read portion of the flaw scan operation. First, second and third embodiments of the method of the present invention are described below.

In a first embodiment, the write signal is simultaneously provided to two or more write heads that simultaneously write the test pattern to two or more disk surfaces of the disk drive. Thereafter, the read signals of two or more read heads are simultaneously processed to identify flaws. Advantageously, this embodiment provides a considerable reduction in the time spent performing the flaw scan as compared to conventional approaches. For instance, in a magnetic disk drive that has seven disks with fourteen disk surfaces and fourteen heads (one for each disk surface), in which writing the test pattern to a disk surface consumes one unit of time and reading the test pattern two times from a disk surface consumes two units of time, the conventional method of performing a flaw scan would require forty two units of time. A flaw scan performed according to this embodiment would only require three units of time if all the write heads are simultaneously used for the writing portion of the flaw scan operation and all the read heads are simultaneously used for the reading portion of the flaw scan operation. This embodiment can be implemented using the preamplifier 80. More specifically, the write portion of the flaw scan operation is implemented by using the bank write circuit 90 to simultaneously provide the write signal to the write heads 86A–86N, and the flaw detectors 98A–98N are used to simultaneously process the read signals from the read heads 84A–84N, respectively, to identify flaws.

In a second embodiment, the write signal is applied to only one write head at a time, and then the read signals of two or more read heads are simultaneously processed to identify flaws. Advantageously, this embodiment provides a considerable reduction in the time spent performing the flaw scan as compared with conventional approaches. For instance, in a magnetic disk drive that has seven disks with fourteen disk surfaces and fourteen heads (one for each disk surface), in which writing the test pattern to a disk surface consumes one unit of time and reading the test pattern two times from a disk surface consumes two units of time, the conventional method of performing a flaw scan would require forty two units of time. A flaw scan performed according to this embodiment would only require sixteen units of time if all the read heads are simultaneously used for the reading portion of the flaw scan operation. This embodiment can be implemented using the preamplifier 80 without the bank write circuit 90. More specifically, the write portion of the flaw scan operation is implemented by using the write multiplexer 88 to provide the write signal to the write heads 86A–86N, one at a time, and the flaw detectors 98A–98N are used to simultaneously process the read signals provided by the read heads 84A–84N, respectively, to identify flaws. Although the second embodiment is slower than the first embodiment, the second embodiment can be performed without the bank write circuit 90.

In a third embodiment, the write signal is simultaneously applied to two or more write heads, and then the read signals are processed from one read head at a time to identify flaws. Advantageously, this embodiment provides a considerable reduction in the time spent performing the flaw scan as compared with conventional approaches. For instance, in a magnetic disk drive that has seven disks with fourteen disk surfaces and fourteen heads (one for each disk surface), in which writing the test pattern to a disk surface consumes one unit of time and reading the test pattern two times from the disk surface consumes two units of time, the conventional method of performing a flaw scan would require forty two units of time. A flaw scan performed according to this embodiment would only require twenty nine units of time if all the write heads are simultaneously used for the writing portion of the flaw scan operation. This embodiment can be implemented using the preamplifier 80 without the flaw detectors 98A–98N or the flaw register 100. More specifically, the write portion of the flaw scan operation is implemented by using the bank write circuit 90 to simultaneously provide the write signal to the write heads 86A–86N, and the read signals provided by the read heads 84A–84N are processed one at a time to identify flaws. Although the third embodiment is slower than the first and second embodiments, the third embodiment can be performed without the flaw detectors 98A–98N or the flaw register 100.

The present invention is also directed to reducing the time required to manufacture a disk drive. The manufacture of a disk drive involves many operations, including servo track writing and flaw detection. Flaw detection is completed after the servo track writing is finished since servo track writing produces servo areas on the disks that are used to define the user data areas and position the heads over the tracks.

Figure 14A:
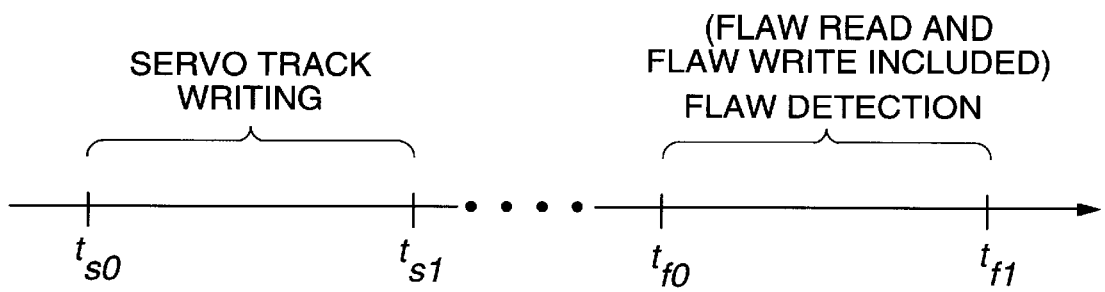
FIG. 14A is a timing diagram of conventional servo track writing and flaw detection operations.

FIG. 14A illustrates a time line for conventional servo track writing and flaw detection operations. The time span $(t_{s1}-t_{s0})$ is required for servo track writing and the time span $(t_{f1}-t_{f0})$ required for the flaw detection operation. The flaw detection operation includes a writing portion and a reading portion. As is seen, there is no time overlap between the servo track writing and the flaw detection operations. Thus, the flaw detection operation begins after the servo track writing is completed.

Figure 14B:
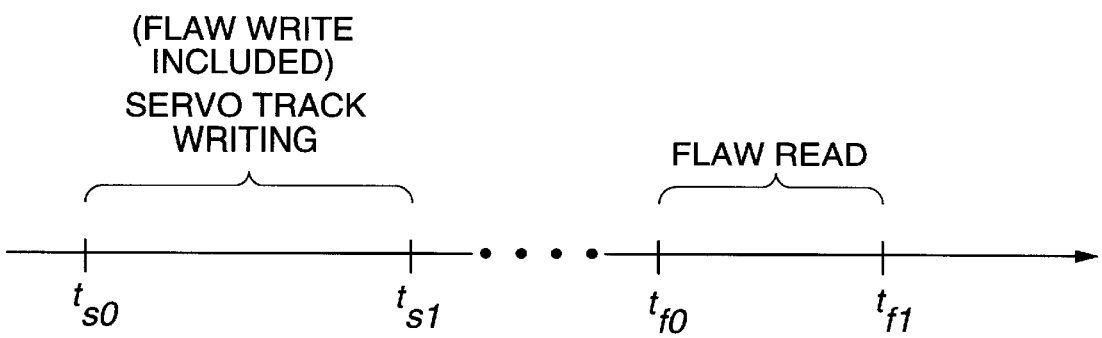
FIG. 14B is a timing diagram of servo track writing and flaw detection operations in accordance with the present invention.

FIG. 14B illustrates a time line for servo track writing and flaw detection in accordance with the present invention. The time span $(t_{s1}-t_{s0})$ is required for servo track writing, and the time span $(t_{r1}-t_{r0})$ is required for the reading portion of the flaw detection operation. As is seen, the servo track writing and the writing portion of the flaw detection operation overlap. Furthermore, the time span required for the servo track writing operation is not appreciably increased by the writing portion of the flaw detection operation. Therefore, little or no additional time is needed for the writing portion of the flaw detection operation. Stated differently, the time span needed to complete the flaw detention operation after the servo track writing operation is completed is the time span needed for the read portion of the flaw detection operation.

Accordingly, the present invention reduces the overall time required to manufacture a disk drive by moving the write portion of the flaw detection operation into the servo track writing operation. The incorporation of the write portion of the flaw detection operation into the servo track writing operation does not increase the time for the servo track writing by the time required to perform the write portion of the flaw detection operation. Preferably, the incorporation of the write portion of the flaw detection operation does not increase the time required for servo track writing at all. For instance, the servo track writing operation involves the writing of servo areas for each sector of each track on a disk surface. In addition, AC wash signals are written midway between the center lines of adjacent tracks, i.e., on the "half" tracks. The AC wash signals allow the read channel automatic gain control to lock up the first time the drive spins up after servo track writing. The AC wash signals in all known servo tracking writing schemes are not suitable for use as a test pattern in the flaw detection operation at least because the AC wash signals are not on the track centerlines, and therefore are not properly located in the user data areas. The present invention realizes that, during the servo track writing operation, the test pattern can be written in the user data areas at the appropriate frequency to detect single bit flaws without increasing the time needed to perform the servo track writing operation because the test pattern also provides an adequate AC wash signal. The time required to manufacture the disk drive can be further reduced by using the methods discussed herein for reducing the time associated with the flaw detection operation by simultaneously using multiple heads to read and/or write the test pattern to detect flaws.

The foregoing description of the invention has been presented for purposes of illustration and description. Further, the description is not intended to limit the invention to the form disclosed herein. Consequently, variations and modifications commensurate with the above teachings, and the skill or knowledge in the relevant art are within the scope of the present invention. The preferred embodiments described herein are further intended to explain the best mode known of practicing the invention and to enable others skilled in the art to utilize the invention in various embodiments and with the various modifications required by their particular applications or uses of the invention. It is intended that the appended claims be construed to include alternate embodiments to the extent permitted by the prior art.

What is claimed is:

1. A preamplifier, comprising:
   a head interface that simultaneously receives a plurality of read signals that are each provided by a separate read head associated with a separate disk surface of a magnetic disk structure;
   processing circuitry that simultaneously processes said read signals to detect whether a flaw exists in any of said disk surfaces; and
   a control circuit interface that provides an error signal to a control circuit in response to said processing circuitry detecting a predetermined number of said flaws.

2. A preamplifier, as claimed in claim 1, wherein said processing circuitry includes a register with storage locations that are each responsive to a one of said read signals indicating the existence of said flaw.

3. A preamplifier, as claimed in claim 2, wherein each of said storage locations stores an error bit in response to one of said read signals indicating the existence of said flaw.

4. A preamplifier, as claimed in claim 3, wherein said storage register provides said error signal when any of said storage locations stores said error bit.

5. A preamplifier, as claimed in claim 1, wherein said processing circuitry includes threshold detectors that each compare amplitudes of half wave signals derived from one of said read signals to a threshold voltage.

6. A preamplifier, as claimed in claim 1, wherein said processing circuitry includes envelope detectors that are each responsive to one of said read signals.

7. A preamplifier, as claimed in claim 1, wherein said processing circuitry includes RC circuits that are each responsive to one of said read signals.

8. A preamplifier, as claimed in claim 7, wherein each of said RC circuits includes means for adjusting an RC time constant.

9. A preamplifier, as claimed in claim 1, further including a multiplexer that routes one of said read signals to said control circuit interface in response to a head select signal received at said control circuit interface.

10. A preamplifier, as claimed in claim 9, further including a plurality of amplifiers coupled between said head interface and said processing circuitry and also coupled between said head interface and said multiplexer, wherein each of said amplifiers receives and amplifies one of said read signals.

11. A preamplifier for use in high speed detection of flaws in a disk drive, the preamplifier comprising:
    first means for simultaneously receiving a plurality of read signals from a plurality of read heads external to said preamplifier that are each associated with a different disk surface of a magnetic disk structure;
    second means, operatively connected to said first means, for simultaneously processing said read signals to detect flaws in said magnetic disk structure and for generating an error signal when a predetermined number of said flaws is detected; and
    third means, operatively connected to said second means, for providing said error signal to circuitry exterior to said preamplifier.

12. A preamplifier, as claimed in claim 11, wherein said second means includes a plurality of low pass filters that each reduce high frequency noise in one of said read signals.

13. A preamplifier, as claimed in claim 11, wherein said second means includes a plurality of half-wave rectifiers that each rectify one of said read signals.

14. A preamplifier, as claimed in claim 13, wherein said second means includes a plurality of threshold detectors that each compare a rectified signal from one of said rectifiers to a predetermined threshold voltage.

15. A preamplifier, as claimed in claim 14, wherein said second means includes a plurality of sequence discriminators that each provide a flaw detect signal in response to an output of one of said threshold detectors.

16. A preamplifier, as claimed in claim 11, wherein said second means includes a register with a plurality of storage locations, and each of said storage locations is associated with one of said read heads.

17. A preamplifier, as claimed in claim 16, wherein each of said storage locations includes a latch that stores an error bit in response to a flaw being detected for said associated one of said read heads, and said register generates said error signal when any of said storage locations contains said error bit.

18. A preamplifier, as claimed in claim 16, wherein each of said storage locations includes a counter that is incremented in response to a flaw being detected for said associated one of said read heads, and said register generates said error signal when any of said counters contains a value that exceeds a predetermined number.

19. A preamplifier, as claimed in claim 11, further comprising fourth means for routing one of said read signals to said circuitry in response to a head select signal received from said circuitry.

20. A preamplifier, as claimed in claim 11, further comprising fourth means for simultaneously transmitting a write signal to a plurality of write heads external to said preamplifier that are each associated with a different disk surface of said magnetic disk structure.

21. A disk drive, comprising:
a plurality of disks that include disk surfaces for storing data;
a spin motor for rotating said disks;
a plurality of read heads and write heads, wherein each of said read heads reads data from a separate one of said disk surfaces and each of said write heads writes data to a separate one of said disk surfaces; and
a flaw detection circuit that simultaneously determines whether a flaw exists in any of said disk surfaces in response to simultaneously generated read signals from each of said read heads.

22. A disk drive, as claimed in claim 21, wherein said read signals are obtained from a test pattern stored in user data areas of sectors of said disk surfaces.

23. A disk drive, as claimed in claim 22, wherein said write heads write said test pattern to said user data areas during a servo track write operation for said disk drive.

24. A disk drive, as claimed in claim 22, wherein said write heads simultaneously write said test pattern to said disk surfaces.

25. A disk drive, as claimed in claim 21, wherein said flaw detection circuit includes low pass filters that each provide a filtered read signal in response to one of said read signals.

26. A disk drive, as claimed in claim 25, wherein said flaw detection circuit includes rectifiers that each provide a rectified read signal in response to one of said filtered read signals.

27. A disk drive, as claimed in claim 26, wherein said flaw detection circuit includes peak detectors that each include an RC circuit that provides a peak detection signal in response to one of said rectified read signals.

28. A disk drive, as claimed in claim 27, wherein said flaw detection circuit includes threshold detectors that each provide an output signal indicative of a comparison between one of said peak detection signals and a threshold voltage.

29. A disk drive, as claimed in claim 28, wherein said flaw detection circuit includes sequence discriminators that each sample one of said output signals to create a pulse stream and generates a flaw detection signal in response to a predetermined number of missing pulses in said pulse stream.

30. A disk drive, as claimed in claim 21, wherein said flaw detection circuit includes a register that includes a storage location for each of said disk surfaces, and said flaw detection circuit provides flaw detect information in one of said storage locations when said flaw exists in one of said disk surfaces associated with said one of said storage locations.

31. A disk drive, as claimed in claim 30, wherein said storage location is a latch and said flaw detection circuit provides said flaw detection information by setting an error bit in said latch.

32. A disk drive, as claimed in claim 31, wherein said flaw detection circuit generates an interrupt signal when any of said latches contains said error bit.

33. A disk drive, as claimed in claim 30, wherein said storage location is a counter and said flaw detection circuit provides said flaw detect information by incrementing said counter.

34. A disk drive, as claimed in claim 33, wherein said flaw detection circuit generates an interrupt signal when any of said counters contains a value that exceeds a predetermined number.

35. A disk drive, as claimed in claim 21, wherein said flaw detection circuit is contained in a preamplifier chip.

36. A disk drive, as claimed in claim 35, wherein said preamplifier chip includes a read multiplexer, an input interface for receiving signals and an output interface for sending signals, said read signals and a read head select signal are received at said input interface, said read multiplexer is responsive to said read signals and said read head select signal, and an output of said read multiplexer is coupled to said output interface.

37. A disk drive, as claimed in claim 36, wherein said preamplifier chip includes a plurality of read amplifiers that each receive one of said read signals and provide an amplified read signal to said flaw detection circuit and said read multiplexer, and said read multiplexer routes one of said amplified read signals as selected by said read head select signal to said output interface.

38. A disk drive, as claimed in claim 21, wherein said flaw is a drop-in flaw.

39. A disk drive, as claimed in claim 21, wherein said flaw is a drop-out flaw.

40. A disk drive, as claimed in claim 21, wherein said flaw is a drop-in flaw or a drop-out flaw.

41. A method for detecting flaws in a disk drive, comprising:
writing a test pattern to at least two disk surfaces using at least two write heads, wherein each of said write heads writes to a separate one of said disk surfaces;
reading said test pattern from said disk surfaces using at least two read heads, wherein each of said read heads reads from a separate one of said disk surfaces; and
processing read signals produced by said read heads in response to reading said test pattern to detect flaws in said disk drive;
wherein at least one of said steps of writing and reading occurs simultaneously for said disk surfaces.

42. A method, as claimed in claim 41, wherein said step of writing includes simultaneously writing said test pattern to said disk surfaces.

43. A method, as claimed in claim 42, wherein said step of reading includes simultaneously reading said test pattern from said disk surfaces.

44. A method, as claimed in claim 43, wherein said step of processing includes simultaneously processing said read signals.

45. A method, as claimed in claim 42, wherein said step of reading includes reading said test pattern from said disk surfaces using one of said read heads at a time.

46. A method, as claimed in claim 42, wherein said step of writing is performed during servo track writing to said disk drive.

47. A method, as claimed in claim 41, wherein said step of reading includes simultaneously reading said test pattern from said disk surfaces.

48. A method, as claimed in claim 47, wherein said step of processing includes simultaneously processing said read signals.

49. A method, as claimed in claim 47, wherein said step of writing includes writing said test pattern to said disk surfaces using one of said write heads at a time.

50. A method, as claimed in claim 47, wherein said step of writing is performed during servo track writing to said disk drive.

51. A method for detecting flaws in a disk drive, comprising:

writing a test pattern to user data areas of a disk surface during servo track writing to said disk surface;

reading said test pattern from said user data areas; and processing a read signal obtained from said reading step to detect flaws on said disk surface.

52. A method, as claimed in claim 51, wherein said step of writing includes simultaneously writing said test pattern to multiple disk surfaces using multiple write heads in said disk drive.

53. A method, as claimed in claim 51, wherein said step of reading includes simultaneously reading said test pattern from multiple disk surfaces using multiple read heads in said disk drive.

54. A method, as claimed in claim 51, wherein said step of processing includes simultaneously processing multiple read signals simultaneously obtained from multiple read heads reading multiple disk surfaces during said reading step.

55. A method, as claimed in claim 51, wherein said step of writing includes simultaneously writing said test pattern to multiple disk surfaces using multiple write heads in said disk drive, said step of reading includes simultaneously reading said test pattern from said multiple disk surfaces using multiple read heads in said disk drive to provide multiple read signals, and said step of processing includes simultaneously processing said multiple read signals to identify defects on any of said multiple disk surfaces.

56. A method, as claimed in claim 51, wherein said step of writing said test pattern during said servo track writing does not increase a time period required for said servo track writing.

57. A method, as claimed in claim 51, wherein said step of reading begins after said servo track writing is completed.

58. A method, as claimed in claim 51, wherein said steps of writing, reading and processing are performed during the manufacture of said disk drive.

59. A method, as claimed in claim 51, wherein said flaws are drop-in flaws.

60. A method, as claimed in claim 51, wherein said flaws are drop-out flaws.

* * * * *